United States Patent
Shiraishi et al.

(10) Patent No.: US 6,748,033 B1
(45) Date of Patent: Jun. 8, 2004

(54) DE-INTERLEAVE CIRCUIT (75) Inventors: Kenichi Shiraishi, Yokohama (JP); Soichi Shinjo, Machida (JP); Akihiro Horii, Zama (JP)

(73) Assignee: Kabushiki Kaisha Kenwood, Tokyo (JP)

( * ) Notice: Subject to any disclaimer, the term of this patent is extended or adjusted under 35 U.S.C. 154(b) by 0 days.

(21) Appl. No.: 09/743,718

(22) PCT Filed: Jul. 8, 1999

(86) PCT No.: PCT/JP99/03707

§ 371 (c)(1),
(2), (4) Date: Jan. 16, 2001

(87) PCT Pub. No.: WO00/04645

PCT Pub. Date: Jan. 27, 2000

(30) Foreign Application Priority Data

Jul. 17, 1998 (JP) ............................................ 10-218705

(51) Int. Cl.[7] .......................... H04L 27/06; H04L 25/40; G06F 12/00
(52) U.S. Cl. .......................... 375/340; 375/372; 711/157
(58) Field of Search .............................. 375/522, 316, 375/341, 377, 222, 262, 372, 340; 711/200, 157, 5, 127; 714/756, 763; 345/540

(56) References Cited

U.S. PATENT DOCUMENTS

| 4,385,206 A | * | 5/1983 | Bradshaw et al. | 709/244 |
|---|---|---|---|---|
| 4,933,846 A | * | 6/1990 | Humphrey et al. | 710/107 |
| 5,319,707 A | * | 6/1994 | Wasilewski et al. | 380/212 |
| 5,384,782 A | * | 1/1995 | Elms | 371/2.1 |
| 5,420,640 A | * | 5/1995 | Munich et al. | 348/525 |
| 5,581,714 A | * | 12/1996 | Amini et al. | 395/308 |
| 5,799,033 A | * | 8/1998 | Baggen | 375/20 |
| 5,850,393 A | * | 12/1998 | Adachi | 370/335 |
| 5,928,371 A | * | 7/1999 | Robimson, Jr. et al. | 714/702 |
| 6,002,407 A | * | 12/1999 | Fadden | 345/430 |
| 6,014,761 A | * | 1/2000 | Lachish et al. | 714/702 |
| 6,075,828 A | * | 6/2000 | DeLaruelle et al. | 375/341 |
| 6,151,690 A | * | 11/2000 | Peeters | 714/701 |

FOREIGN PATENT DOCUMENTS

| EP | 000773639 A2 | * | 5/1997 | |
|---|---|---|---|---|
| JP | 06-034306 | | 11/1984 | |
| JP | 62 -298077 | * | 12/1987 | G06F/12/00 |
| JP | 1 -93277 | * | 4/1989 | H04N/7/13 |
| JP | 08-279766 | | 10/1996 | |
| JP | 09-074361 | | 3/1997 | |
| JP | 09-266471 | | 10/1997 | |
| JP | 10-163887 | | 6/1998 | |

OTHER PUBLICATIONS

"Notification of Refusal Reason", dated Mar. 15, 2002 and English translation.
"Patentable Decision", dated Aug. 16, 2002 and English translation.
International Search Report.

* cited by examiner

Primary Examiner—Tesfaldet Bocure
(74) Attorney, Agent, or Firm—Eric J. Robinson; Robinson Intellectual Property Law Office, P.C.

(57) ABSTRACT

To provide a de-interleave circuit used for a BS digital broadcasting receiver. The de-interleave circuit is provided with less memory. An address data generator (3) supplies address data (A) to a de-interleave memory (4) in a de-interleave order. Each main signal is read from an address location in the de-interleave memory (4) specified by address data (A), and a following main signal is interleaved and written in that address location of the memory. As a result, the de-interleave memory (4) only requires space for one superframe.

2 Claims, 12 Drawing Sheets

| A[0]<br>D[0] | A[1]<br>D[1] | A[2]<br>D[2] | A[3]<br>D[3] | A[4]<br>D[4] |
|---|---|---|---|---|
| A[5]<br>D[5] | A[6]<br>D[6] | A[7]<br>D[7] | A[8]<br>D[8] | A[9]<br>D[9] |
| A[10]<br>D[10] | A[11]<br>D[11] | A[12]<br>D[12] | A[13]<br>D[13] | A[14]<br>D[14] |
| A[15]<br>D[15] | A[16]<br>D[16] | A[17]<br>D[17] | A[18]<br>D[18] | A[19]<br>D[19] |

m=5 (WRITE DIRECTION) →

DEPTH n=4

| A[0]<br>D[0] | A[1]<br>D[5] | A[2]<br>D[10] | A[3]<br>D[15] | A[4]<br>D[1] |
|---|---|---|---|---|
| A[5]<br>D[6] | A[6]<br>D[11] | A[7]<br>D[16] | A[8]<br>D[2] | A[9]<br>D[7] |
| A[10]<br>D[12] | A[11]<br>D[17] | A[12]<br>D[3] | A[13]<br>D[8] | A[14]<br>D[13] |
| A[15]<br>D[18] | A[16]<br>D[4] | A[17]<br>D[9] | A[18]<br>D[14] | A[19]<br>D[19] |

(b)

| A[0]<br>D'[0] | A[1]<br>D'[6] | A[2]<br>D'[12] | A[3]<br>D'[18] | A[4]<br>D'[5] |
|---|---|---|---|---|
| A[5]<br>D'[11] | A[6]<br>D'[17] | A[7]<br>D'[4] | A[8]<br>D'[10] | A[9]<br>D'[16] |
| A[10]<br>D'[3] | A[11]<br>D'[9] | A[12]<br>D'[15] | A[13]<br>D'[2] | A[14]<br>D'[8] |
| A[15]<br>D'[14] | A[16]<br>D'[1] | A[17]<br>D'[7] | A[18]<br>D'[13] | A[19]<br>D'[19] |

(c)

| A[0]<br>D"[0] | A[1]<br>D"[11] | A[2]<br>D"[3] | A[3]<br>D"[14] | A[4]<br>D"[6] |
|---|---|---|---|---|
| A[5]<br>D"[17] | A[6]<br>D"[9] | A[7]<br>D"[1] | A[8]<br>D"[12] | A[9]<br>D"[4] |
| A[10]<br>D"[15] | A[11]<br>D"[7] | A[12]<br>D"[18] | A[13]<br>D"[10] | A[14]<br>D"[2] |
| A[15]<br>D"[13] | A[16]<br>D"[5] | A[17]<br>D"[16] | A[18]<br>D"[8] | A[19]<br>D"[19] |

FIG. 6

ADDRESS SET NUMBER x →

| | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 0 | 0 | 0 | 0 |
| 1 | 1 | 4 | 16 | 7 | 9 | 17 | 11 | 6 | 5 | 1 |
| 2 | 2 | 8 | 13 | 14 | 18 | 15 | 3 | 12 | 10 | 2 |
| 3 | 3 | 12 | 10 | 2 | 8 | 13 | 14 | 18 | 15 | 3 |
| 4 | 4 | 16 | 7 | 9 | 17 | 11 | 6 | 5 | 1 | 4 |
| 5 | 5 | 1 | 4 | 16 | 7 | 9 | 17 | 11 | 6 | 5 |
| 6 | 6 | 5 | 1 | 4 | 16 | 7 | 9 | 17 | 11 | 6 |
| 7 | 7 | 9 | 17 | 11 | 6 | 5 | 1 | 4 | 16 | 7 |
| 8 | 8 | 13 | 14 | 18 | 15 | 3 | 12 | 10 | 2 | 8 |
| 9 | 9 | 17 | 11 | 6 | 5 | 1 | 4 | 16 | 7 | 9 |
| 10 | 10 | 2 | 8 | 13 | 14 | 18 | 15 | 3 | 12 | 10 |
| 11 | 11 | 6 | 5 | 1 | 4 | 16 | 7 | 9 | 17 | 11 |
| 12 | 12 | 10 | 2 | 8 | 13 | 14 | 18 | 15 | 3 | 12 |
| 13 | 13 | 14 | 18 | 15 | 3 | 12 | 10 | 2 | 8 | 13 |
| 14 | 14 | 18 | 15 | 3 | 12 | 10 | 2 | 8 | 13 | 14 |
| 15 | 15 | 3 | 12 | 10 | 2 | 8 | 13 | 14 | 18 | 15 |
| 16 | 16 | 7 | 9 | 17 | 11 | 6 | 5 | 1 | 4 | 16 |
| 17 | 17 | 11 | 6 | 5 | 1 | 4 | 16 | 7 | 9 | 17 |
| 18 | 18 | 15 | 3 | 12 | 10 | 2 | 8 | 13 | 14 | 18 |
| 19 | 19 | 19 | 19 | 19 | 19 | 19 | 19 | 19 | 19 | 19 |

ADDRESS NUMBER y ↓

ADDRESS SET NUMBER x / ADDRESS NUMBER y

| | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 |
| 1 | 1 | 8 | 64 | 512 | 850 | 308 | 841 | 236 | 265 | 497 | 730 | 971 | 1276 | 470 | 514 | 866 | 436 | 242 |
| 2 | 2 | 16 | 128 | 1024 | 77 | 616 | 59 | 472 | 530 | 994 | 1460 | 319 | 929 | 940 | 1028 | 109 | 872 | 484 |
| 3 | 3 | 24 | 192 | 1536 | 927 | 924 | 900 | 708 | 795 | 1491 | 567 | 1290 | 582 | 1410 | 1542 | 975 | 1308 | 726 |
| 4 | 4 | 32 | 256 | 425 | 1541 | 1232 | 118 | 944 | 1060 | 365 | 1297 | 638 | 235 | 1410 | 433 | 218 | 121 | 968 |
| 5 | 5 | 40 | 320 | 937 | 1004 | 1540 | 959 | 1180 | 1325 | 862 | 404 | 1609 | 1511 | 257 | 947 | 1084 | 557 | 1210 |
| 6 | 6 | 48 | 384 | 1449 | 231 | 225 | 177 | 1416 | 1590 | 1359 | 1134 | 957 | 1164 | 727 | 1461 | 327 | 993 | 1452 |
| 7 | 7 | 56 | 448 | 338 | 1081 | 533 | 1018 | 29 | 232 | 233 | 241 | 305 | 817 | 44 | 352 | 1193 | 1429 | 71 |
| 8 | 8 | 64 | 512 | 850 | 308 | 841 | 236 | 265 | 497 | 730 | 971 | 1276 | 470 | 514 | 866 | 436 | 242 | 313 |
| 9 | 9 | 72 | 576 | 1362 | 1158 | 1149 | 1077 | 501 | 762 | 1227 | 78 | 624 | 123 | 984 | 1380 | 1302 | 678 | 555 |
| 10 | 10 | 80 | 640 | 251 | 385 | 1457 | 295 | 737 | 1027 | 101 | 808 | 1595 | 1399 | 1454 | 271 | 545 | 114 | 797 |
| 11 | 11 | 88 | 704 | 763 | 1235 | 142 | 1138 | 973 | 1292 | 598 | 1538 | 943 | 1052 | 301 | 785 | 1411 | 1550 | 1039 |
| 12 | 12 | 96 | 768 | 1275 | 462 | 450 | 354 | 1209 | 1557 | 1095 | 645 | 291 | 705 | 771 | 1299 | 654 | 363 | 1281 |
| 13 | 13 | 104 | 832 | 164 | 1312 | 758 | 1195 | 1445 | 199 | 1592 | 1375 | 1262 | 358 | 1241 | 1901 | 1520 | 799 | 1523 |
| 14 | 14 | 112 | 896 | 676 | 539 | 1068 | 413 | 58 | 464 | 466 | 482 | 610 | 11 | 88 | 704 | 763 | 1235 | 142 |
| 15 | 15 | 120 | 960 | 1188 | 1389 | 1374 | 1254 | 294 | 729 | 963 | 1212 | 1581 | 1287 | 558 | 1218 | 6 | 48 | 384 |
| 16 | 16 | 128 | 1024 | 77 | 616 | 59 | 472 | 530 | 994 | 1460 | 319 | 929 | 940 | 1028 | 109 | 872 | 484 | 626 |
| 17 | 17 | 136 | 1088 | 589 | 1466 | 367 | 1313 | 766 | 1259 | 334 | 1049 | 277 | 593 | 1498 | 623 | 115 | 920 | 868 |
| 18 | 18 | 144 | 1152 | 1101 | 693 | 675 | 531 | 1002 | 1524 | 831 | 158 | 1248 | 246 | 345 | 1137 | 981 | 1356 | 1110 |
| 19 | 19 | 152 | 1216 | 1613 | 1543 | 983 | 1372 | 1238 | 166 | 1328 | 886 | 596 | 1522 | 815 | 28 | 224 | 1691 | 1352 |
| 20 | 20 | 160 | 1280 | 502 | 770 | 1291 | 590 | 1474 | 431 | 202 | 1616 | 1567 | 1175 | 1285 | 542 | 1090 | 605 | 1594 |
| 21 | 21 | 168 | 1344 | 1014 | 1620 | 1599 | 1431 | 87 | 696 | 699 | 723 | 915 | 828 | 132 | 1056 | 333 | 1041 | 213 |
| 22 | 22 | 176 | 1408 | 1526 | 847 | 284 | 649 | 323 | 961 | 1196 | 1453 | 263 | 481 | 602 | 1570 | 1199 | 1477 | 455 |
| 23 | 23 | 184 | 1472 | 415 | 74 | 592 | 1490 | 559 | 1226 | 70 | 560 | 1234 | 1341 | 1072 | 461 | 442 | 290 | 697 |

FIG. 12

DE-INTERLEAVE CIRCUIT

TECHNICAL FIELD

The present invention relates to a de-interleave circuit used for a BS digital broadcasting receiver.

BACKGROUND ART

As is already known, an interleave system in a BS digital broadcasting receiver performs block interleave, 8×203 bytes in terms of bytes, interleaving between slots with a same slot number in each frame in the superframe direction.

Here, an MPEG2-TS bucket of a main signal of a BS digital broadcasting signal comprises 1 slot made up of 204 bytes, 203 bytes including parity 16 bytes for correction of external code errors plus 1 byte of a TMCC (Transmission and Multiplexing Configuration Control) signal to indicate a synchronization signal, modulation system and error correction system, etc., with 48 slots forming 1 frame and 8 frames forming 1 superframe.

De-interleaving data interleaved as shown above requires a memory with a storage capacity for 2 superframes. This requires a memory with a storage capacity of a maximum of 155904 bytes (=203 (bytes)×48 (slots)×8 frames×2 (superframes)).

However, configuring a conventional de-interleave circuit using a memory with a storage capacity amounting to 2 superframes involves such a problem that the number of gates increases when the de-interleave circuit is implemented with an integrated circuit and at the same time the chip area increases.

It is an object of the present invention to provide a de-interleave circuit that requires less memory.

DISCLOSURE OF THE INVENTION

The de-interleave circuit according to the present invention is a de-interleave circuit in a BS digital broadcasting receiver provided with address data generating means that generates address data A, in which assuming that the number of main signals in 1 slot is m, the depth of de-interleave is n, a specific address number assigned to a de-interleave memory is y, address data that specifies a data read/write address location is A, a modulo b is a remainder of a−αb (α: a natural number including 0), when (y≠n×m−1), A=y×n to the xth power modulo (n×m−1), and when (y=n×m−1), A=y, address set number x, which is the number of times data of up to address number y is repeatedly specified, is such an x that when y=1, A=1 in A=y×n to the xth power modulo (n×m−1) and when the value of y×n to the xth power is less than (n×m−1), A=(y×n to the xth power), and is characterized in that the main signal stored in the address location in a memory specified by the address data generated by the address generating means is read and the following main signal, which is interleaved and input, is written in that address location.

In the de-interleave circuit according to the present invention, the main signal stored in the address location in memory specified by address data A generated by the address generating means is read. Since the following main signal, which is interleaved and input, is written in the address location, which has been substantially emptied by the aforementioned read, de-interleave can be performed with a storage capacity for a de-interleave memory and the de-interleave memory requires a storage capacity only ½ of the conventionally required storage capacity of 2 superframes, which means that the required area is reduced when the circuit is implemented with an integrated circuit.

In the de-interleave circuit according to the present invention, the address data generating means is provided with:

a base-m counter that counts the number of main signals input;

a base-S counter that counts a carry of the base-m counter;

a multiplier that multiplies the count value of the base-S counter by (n×m);

offset value counting means that counts the number of main signals in the slot direction, shifts by one stage in the n direction when the main signal count value reaches (m−1) and counts main signals in the slot direction, and continues to count by repeating this procedure until the count value reaches (n×m); and adding means that adds up the output of the multiplier and the count value of the offset value counting means, and is characterized in that the output of the adding means is deemed as address data A.

De-interleave is performed by reading a main signal from the address location in a memory specified by the address data output from the address generating means and writing the main signal.

BEST MODE FOR CARRYING OUT THE INVENTION

Hereinafter, the de-interleave circuit of the present invention will be explained according to an embodiment.

Figure 1:
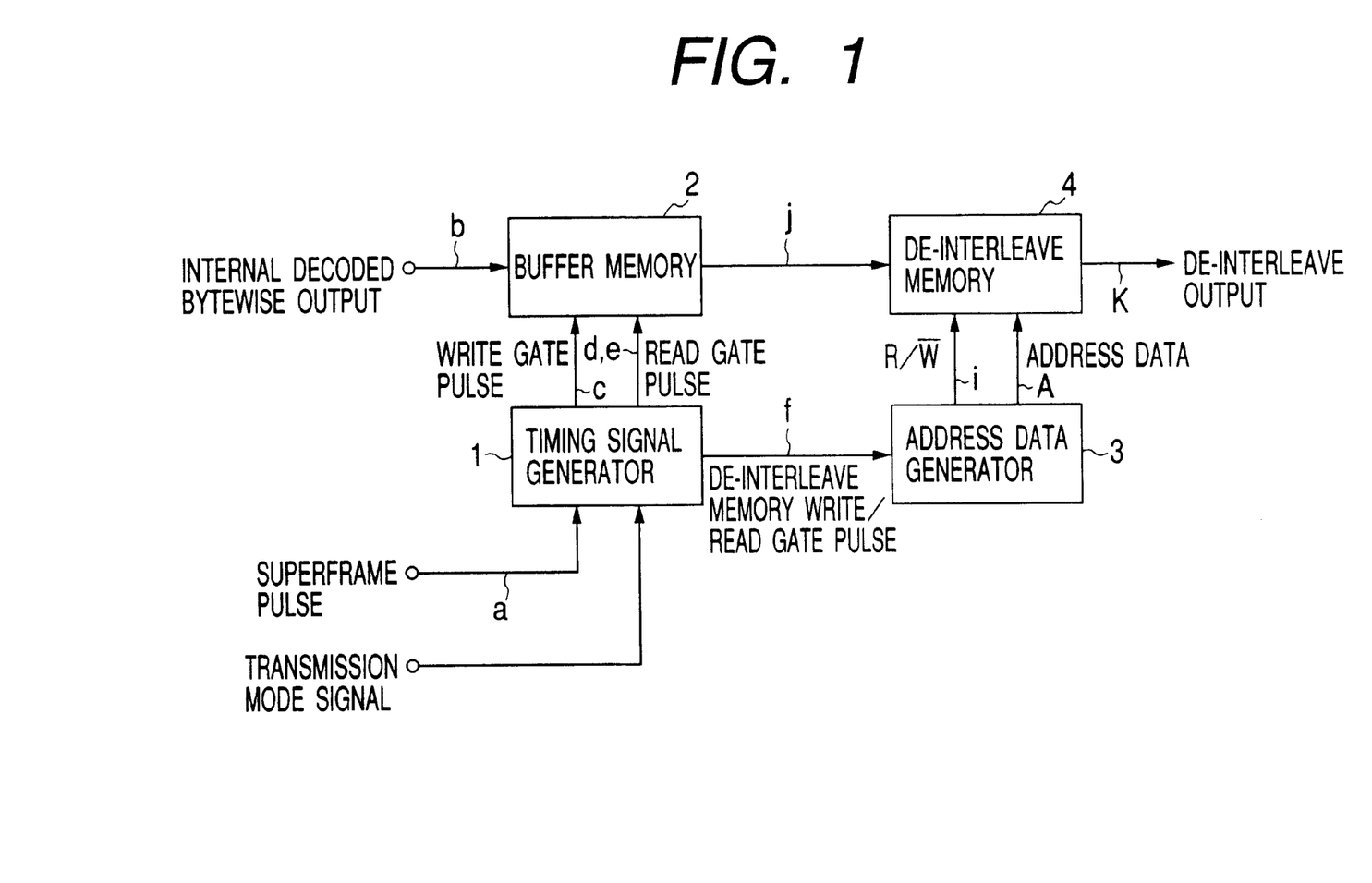
FIG. 1 is a block diagram showing a configuration of a de-interleave circuit according to an embodiment of the present invention.

FIG. 1 is a block diagram showing a configuration of the de-interleave circuit according to an embodiment of the present invention. The de-interleave circuit according to the embodiment of the present invention describes a case with a trellis coding system (hereinafter the trellis coding system will be referred to as "TC") 8PSK (coding rate r=⅔) of 46 slots and a convolutional coding and punctured coding system QPSK (coding rate r=½) of 1 slot.

Figure 3:
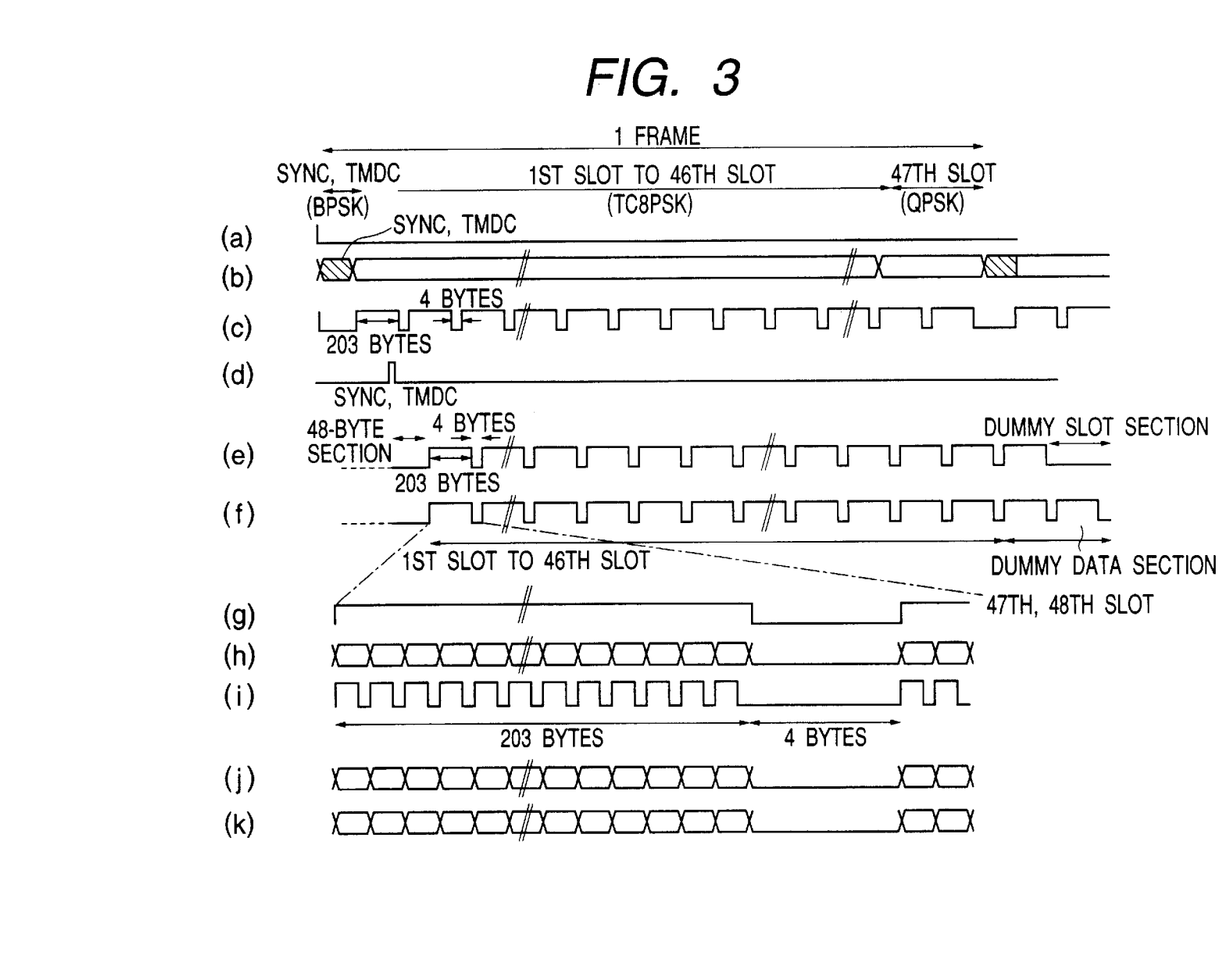
FIGS. 3a–h are schematic diagrams to explain a timing signal of a timing signal generator in the de-interleave circuit according to the embodiment of the present invention.

FIG. 3a shows a superframe pulse "a" output in synchronization with each superframe. An output (bytewise), which is a BS digital broadcasting signal received and then decoded, that is, a trellis code or internal decoded data "b" shown in FIG. 3b, which is bytewise decoded by a trellis/Viterbi decoder, which is a decoder for a convolutional code are output in synchronization with superframe pulse "a." The internal decoded data "b" is written in a buffer memory 2 after receiving a write gate pulse "c" shown in FIG. 3c output from a timing signal generator 1, which receives a superframe timing signal and transmission mode signal.

This write is stored when a main signal of 203 bytes is written in the buffer memory 2 made up of, for example, an FIFO, by a write gate pulse "c" and stored. A sync signal, a TMCC signal and a burst symbol signal are separated and are not written in the buffer memory 2 and no data is written during this period. The description of 4 bytes in FIG. 3c shows a burst symbol period.

Here, the data rate of the bytewise data depends on the modulation system and coding rate, and if, for example, the data rate of a TC8PSK code (coding rate r=⅓ (hereinafter the coding rate =⅓ may be omitted)) is 1, then the data rate of a QPSK code (coding rate r=½ (hereinafter the coding rate r=½ may be omitted)) is ½. Therefore, this embodiment shows a case with the 8PSK code of 46 slots and QPSK code of 1 slot. The information bit transmission efficiency of the QPSK code is ½ of that of the 8PSK code and has 2 transmission slots because the signal is demodulated at a fixed symbol rate and 1 frame comprises 48 slots.

Moreover, the data rate of a BPSK code (coding rate r=½ (hereinafter the coding rate r=½ may be omitted)) is ¼. During a period of a sync signal and the TMCC signal transferred with BPSK (coding rate r=½), the data rate is ¼ of that of TC8PSK and 4 bytes of a burst symbol signal are transmitted with QPSK (coding rate r=½) and the data rate of the burst symbol signal is ½.

When a main signal of 203 bytes is written in the buffer memory 2 upon reception of the write gate pulse "c" output from the timing signal generator 1, the TMCC signal and the burst symbol signal are separated from the main signal and are not written in the buffer memory 2 as described above.

Upon reception of a read gate pulse "e" shown in FIG. 3e output from the timing signal generator 1 starting at the time of generation of the read start pulse "d" shown in FIG. 3d with a predetermined time difference from the superframe pulse shown in FIG. 3a, reading of the internal decoded output "b" written in the buffer memory 2 is substantially stopped during the TMCC signal and a burst symbol signal and a main signal "j" of 203 bytes (hereinafter, the description of "bytes" of 203 bytes may be omitted) is read in a burst-like manner from the buffer memory 2 at a certain speed. Furthermore, a de-interleave memory write/read gate pulse "f" shown in FIG. 3f (a partially enlarged view is shown in FIG. 3g) is output from the timing signal generator 1 to the address data generator 3.

From the address data generator 3 that has received the de-interleave memory write/read gate pulse "f," address data A shown in FIG. 3h and R/W signal "i" shown in FIG. 3i are output to the de-interleave memory 4, main signal "j" of 203 bytes shown in FIG. 3j is written in the de-interleave memory 4 sequentially, and based on read address specification, de-interleave is performed when a read is performed from the de-interleave memory 4 and de-interleaved main signal "k" of 203 bytes shown in FIG. 3k is output from the de-interleave memory 4.

For the R/W signal "i," a read instruction is executed at a high potential and a write instruction is executed at a low potential and the next supplied main signal is written at the address at which the main signal "i" is read by address specification according to address data A.

Figure 2:
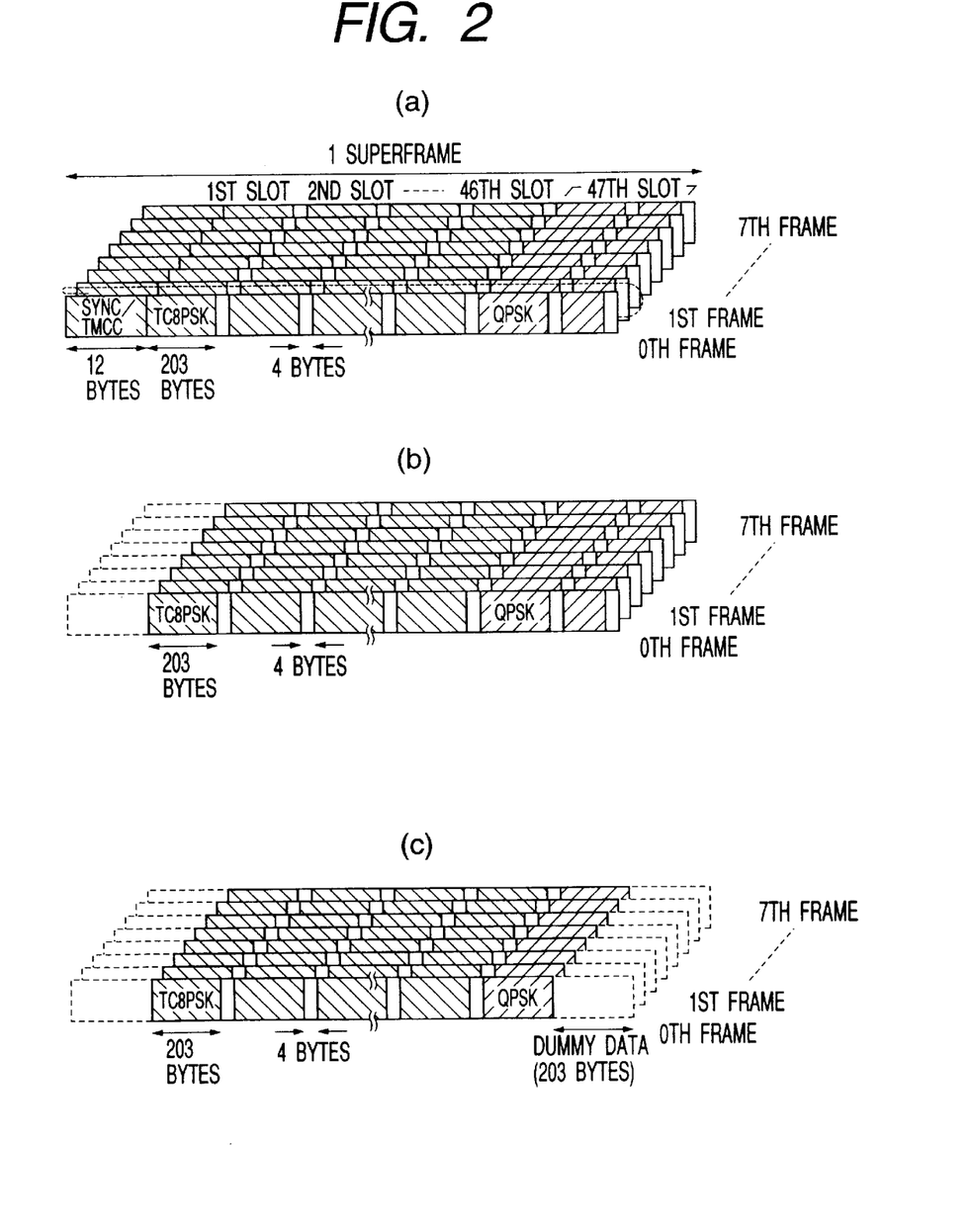
FIGS. 2(a)–2(c) are schematic diagrams to explain input/output data of a buffer memory in the de-interleave circuit according to the embodiment of the present invention.

Then, detailed explanation will be given based on FIG. 2. FIG. 2 shows a data frame configuration of each processing process according to this embodiment.

FIG. 2a shows internal decoded data "b" supplied to the buffer memory 2. The internal decoded data "b" shown in FIG. 2a shows a frame configuration corresponding to 1 superframe when transmission is carried out 46 slots with a TC8PSK signal and 1 slot with a QPSK signal (coding rate r=½). 1 frame is configured by a sync/TMCC signal of 12 bytes followed by a TC8PSK main signal of 203 bytes, an empty section corresponding to a burst symbol signal of 4 bytes, a main signal of 203 bytes, an empty section corresponding to a burst symbol signal of 4 bytes, . . . , a "QPSK (coding rate r=½) main signal of 203 bytes and an empty section corresponding to a burst symbol signal of 4 bytes. Furthermore, 8 frames, the 0th frame to the 7th frame, make up 1 superframe.

The data stream of the internal decoded data "b" shown in FIG. 2a is written and stored in the buffer memory 2 by the write gate pulse "c" only during a high-potential period of the gate pulse. As shown in FIG. 2b, the main signals, that is, signals other than the sync signal, TMCC signal and burst symbol signal section are written in the buffer memory 2.

Upon reception of superframe pulse "a," the timing signal generator 1 generates read start signal "d," which is delayed by a certain time, and at this timing, read gate pulse "e" is output. Upon reception of read gate pulse "e," a read is performed from the buffer memory 2 at a certain rate. Suppose the reading rate is the rate of 8PSK, which is the basic rate.

Read gate pulse "e" comprises a 48-byte stop of sync/TMCC signal section, 203-byte read, 4-byte stop, 203-byte read, 4-byte stop, 203-byte stop and 4-byte stop. The reason that the sync/TMCC signal section has 48 bytes is that the data rate is ¼ during a write, while the data rate is quadrupled (12 bytes×4=48) during a read.

The reason that the pulse ends with a 203-byte stop is that the information bit transmission efficiency of the main signal QPSK code is ½ of that of the TS8PSK code and has 2 transmission slots because it has been demodulated at a fixed symbol rate, but it has been changed to 203 bytes by internal decoding and dummy data is inserted into this section. FIG. 2c shows the dummy data inserted in the section assigned to the 203-byte stop.

Here, it is assumed that no burst symbol signal is written in the buffer memory 2, but it is also possible to write the burst signal together with the main signal and also read the burst signal. In this case, the 4-byte low potential section of the buffer memory write gate pulse "c" shown in FIG. 3c and the read gate pulse "e" shown in FIG. 3e can be changed to a high potential section.

From the timing signal generator 1, the de-interleave memory write/read gate pulse "f" shown in FIG. 3f is output to the address data generator 3. Upon reception of the de-interleave memory write/read gate pulse "f," address data A and R/W signal "i" are output from the address data generator 3 to the de-interleave memory 4 and de-interleave is performed.

Output data "j" including the dummy data shown in FIG. 2c from the buffer memory 2 is written and read to/from the de-interleave memory 4 through address data A and R/W signal "i" whose timing is matched with the de-interleave memory write/read gate pulse. FIGS. 3g to 3k show enlarged views of the de-interleave memory write/read gate pulse 6 for 1 slot and at the same time show enlarged views of address data A and R/W signal "i" for 1 slot and write data "i" and read data "k" in the de-interleave memory.

Figure 8:
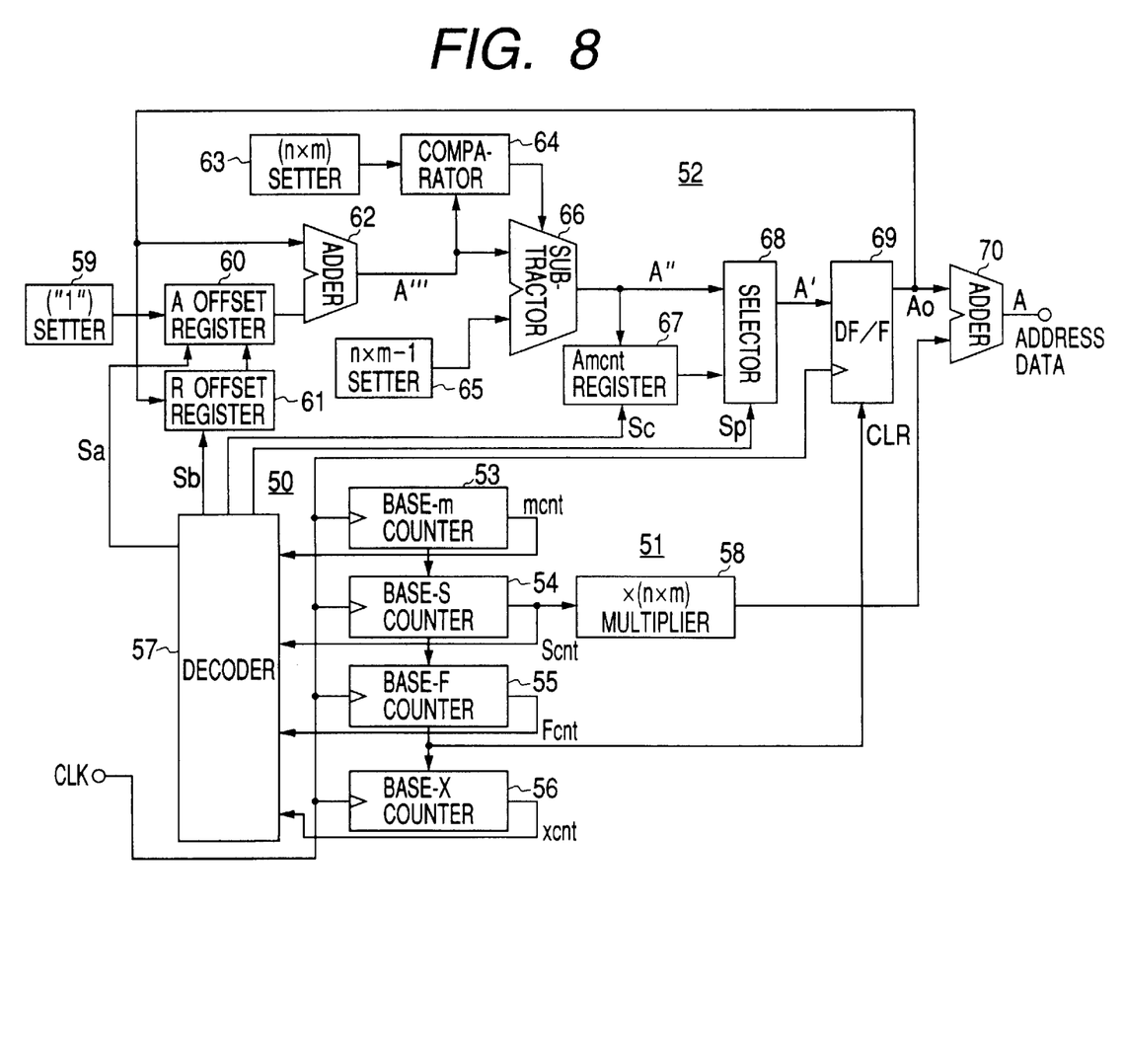
FIG. 8 is a block diagram showing a configuration of an address data generator in the de-interleave circuit according to the embodiment of the present invention.

As is also apparent from FIG. 8, de-interleaved data "k" preceding by 1 superframe is read first and then data "j" to be currently de-interleaved is written. Furthermore, by writing write data "j" at the same address that data "k" is read, the timings for write data and read data become the same. The read data "k" is de-interleaved data and has the same frame configuration as that shown in FIG. 2c.

De-interleave is performed by an operation to write or read to/from the de-interleave memory 4. Then, the address data generator 3 will be explained.

Before explaining the address data generator 3 in detail, the principle of address generation will be explained based on FIG. 4, FIG. 5 and FIG. 6.

Figure 4:
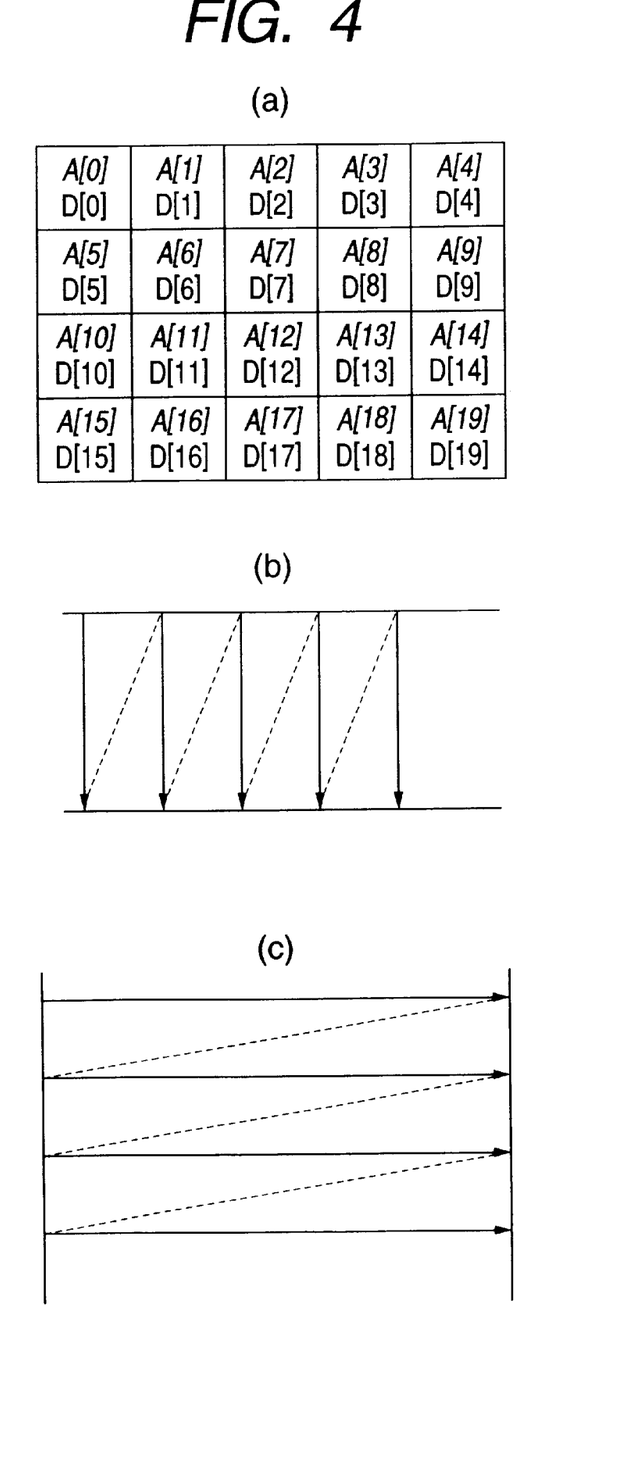
FIGS. 4a–c are schematics diagram to explain interleave, which is de-interleaved by the de-interleave circuit according to the embodiment of the present invention.
Figure 5:
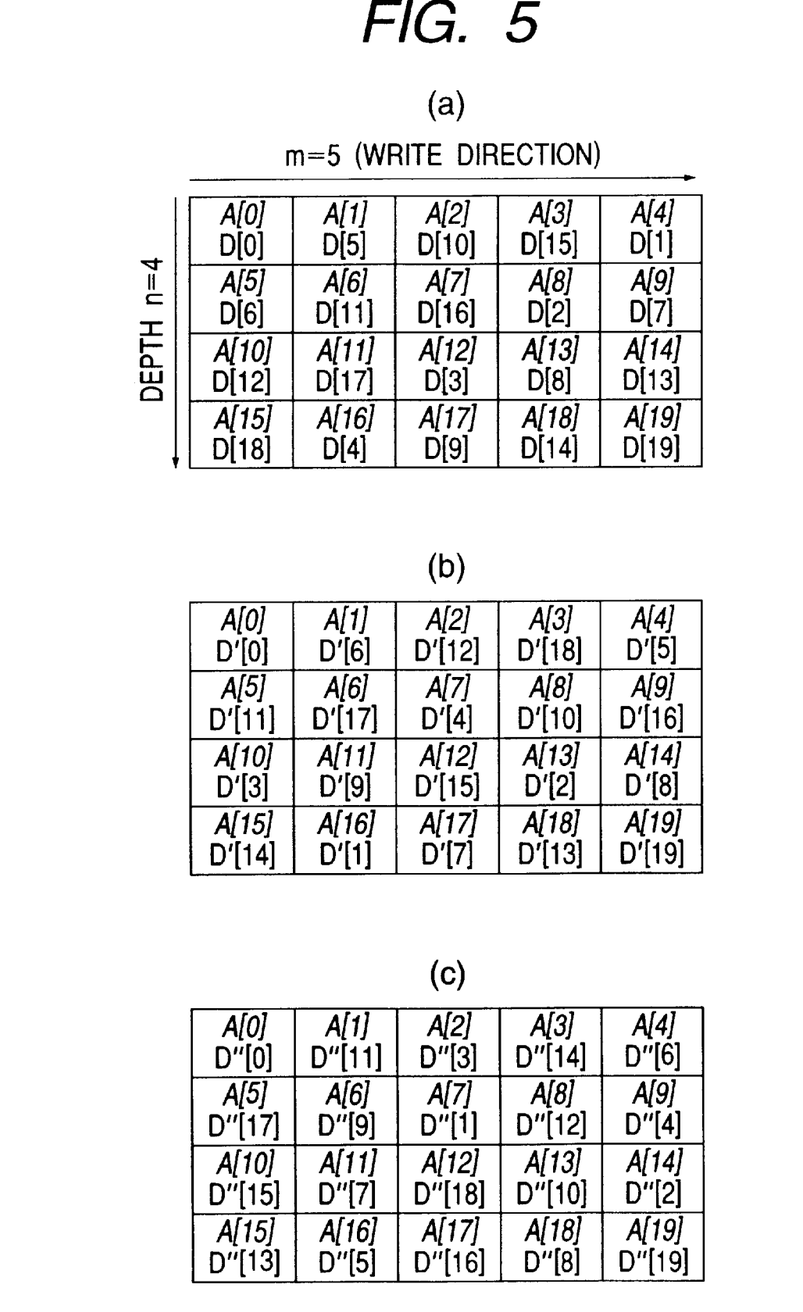
FIGS. 5a–c are schematic diagram to explain the principle of de-interleave in the de-interleave circuit according to the embodiment of the present invention.
Figure 6:
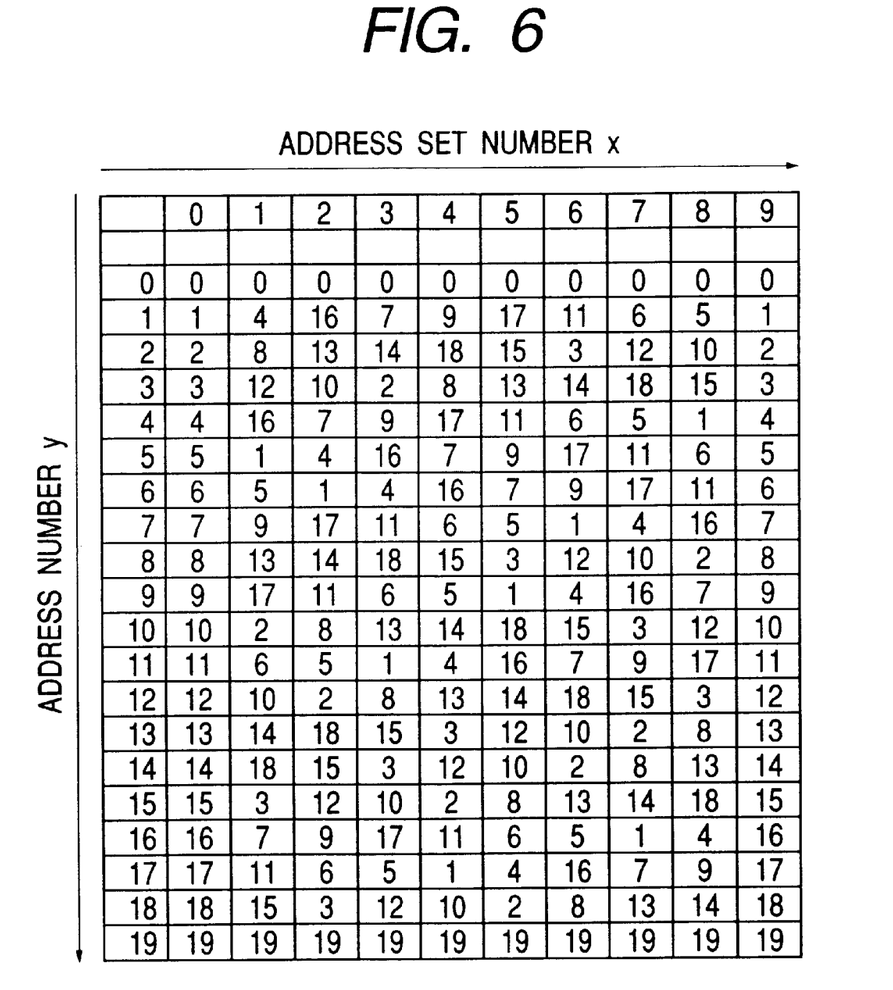
FIG. 6 is a schematic diagram to explain the principle of de-interleave in the de-interleave circuit according to the embodiment of the present invention.

In FIG. 4, FIG. 5 and FIG. 6, "m" denotes a basic unit (=203 bytes in the case of BS digital broadcasting) of data length and "n" denotes a depth of interleave (=8 in the case of BS digital broadcasting (the number of frames that make up 1 superframe)), and supposing m=5 and n=4 here for simplicity, FIG. 4, FIG. 5 and FIG. 6 show an example of de-interleave of n×m=4×5.

The upper row of the de-interleave matrix in FIG. 4a and FIGS. 5a, b and c indicates address data and the lower row indicates data entered. As shown in FIG. 4a, data stream D[0], D[1], D[2], D[3], . . . , D[18], D[19] are written for address data A[0], A[1], A[2], A[3], . . . , A[18] and A[19]. This data is sequentially written in the horizontal direction as shown in FIG. 4c, and interleaved by being read sequentially in the vertical direction as shown in FIG. 4b.

This state is shown in FIG. 5a and this state is assumed to be the case where address set number x=0. In this state, address data A[0], A[1], A[2], A[3], A[4], A[5], . . . , A[18] and A[19] are sequentially output from the address data generator 3, and interleaved data stream D[0], D[5], D[10], D[15], D[1], D[6]. . . , D[14], D[19] of a depth of 4 for data stream D[0], D[1], D[2], D[3], D[4], D[5], . . . , D[18], D[19] are written.

In this case, the address data output from the address data generator 3 is of a simple increment and this is called "basic address set." For the read address data from the de-interleave memory 4, address data of A[0], A[4], A[8], A[12], A[16], A[1], . . . , A[15], A[19] are output sequentially from the address data generator 3 so that the data stream after being read becomes the state before being interleaved D[0], D[1], D[2], D[3], D[4], D[5], . . . , D[18], D[19]. This address set number x is assumed to be 1.

The next data stream is written at the address at which the read is performed. This data stream is D'[0], D'[5], D'[10], D'[15], D'[1], D'[6]. . . , D'[14], D'[19] and FIG. 5b shows the state in which this data stream is written.

Likewise, in the case where data is de-interleaved, if addressing is performed so that the address data is output as A[0], A[16], A[13], A[10], A[7], A[4], . . . , A[3], A[19], then data D'[0], D'[1], D'[2], D'[3], D'[4], D'[5], . . . , D'[18], D'[19] is obtained. This is the state of address set number x=2.

Moreover, in the order of this address data, that is, in the order of address locations specified by address data in which data is read, data D"[0], D"[5], D"[10], D"[15], D"[1], D"[6], . . . , D"[14], D"[19] is written (FIG. 5c) and if data is read from the positions specified by address data A[0], A[7], A[14], A[2], A[9], A[16], . . . , A[12], A[19] of address set number x=3, then data D"[0], D"[1], D"[2], D"[3], D"[4], D"[5], . . . , D"[18], D"[19] is output.

FIG. 6 shows the progression of address data A corresponding to address number y corresponding to specific address data assigned to the de-interleave memory 4 and address set number x, which is the number of times data of up to address number y, which corresponds to the number of times data is read/written, is repeatedly specified, and if the case with address set number x=2 is explained as an example, it is shown that specific address numbers A[0], A[16], A[13], A[10], A[7], A[4], . . . , A[3], A[19] which are assigned to the de-interleave memory 4 are output as address data from the address data generator 3.

Here, the de-interleave procedure can be summarized as follows:

a. Read with address set number x=0 (omitted at first)
   b. Write with address set number x=0
   c. Read with address set number x=1
   d. Write with address set number x=1
   e. Read with address set number x=2
   f. Write with address set number x=2

.
   .
   .

q. Read with address set number x=8
   r. Write with address set number x=8
   s. Read with address set number x=9 (=0)
and thus data, which is input, is written at the address of the address data whose data has been read. In this way, it is seen that specification of address data with de-interleave of n×m=4×5 circulates in a cycle of address set number x of 9. The cycle of address set number x is 9 and this is described as cycle X. Cycle X=0 has no meaning, and therefore X=0 is excluded.

Then, this addressing will be expressed in a general expression. Suppose the depth of de-interleave is n, the number of basic unit data items is m, the address set number is x, the address number is y and the address data is A, then address data A is specified as follows:

$$A = y \times n \text{ to xth power modulo } (n \times m - 1)$$
$$(y \neq n \times m - 1) \qquad (1)$$
$$A = y \quad (y = n \times m - 1) \qquad (2)$$

In this case, suppose a modulo b is a remainder of a-αb (α is a natural number including 0) and if a is smaller than b, a modulo b is a.

Cycle X of address set number x is obtained by obtaining x, which satisfies y=1 and A=1 in expression (1) and in this case, X=9 as described above.

The examples shown in FIG. 4, FIG. 5 and FIG. 6 are expressed in a general expression with respect to de-interleave on a two-dimensional address matrix, and are also applicable to de-interleave of a BS digital broadcasting signal. With the BS digital broadcasting signal, interleave with a depth of 8 is carried out between the same slots in the frame direction. A main signal of 203 bytes is assigned to 1 slot and it is possible to handle the main signal as a set of 48 (slot) two-dimensional matrices of 203 (bytes)×8 (frames). That is, a memory space corresponding to 1 superframe is divided into 48 portions and 203×8 de-interleaves are performed in each area.

Figure 7:
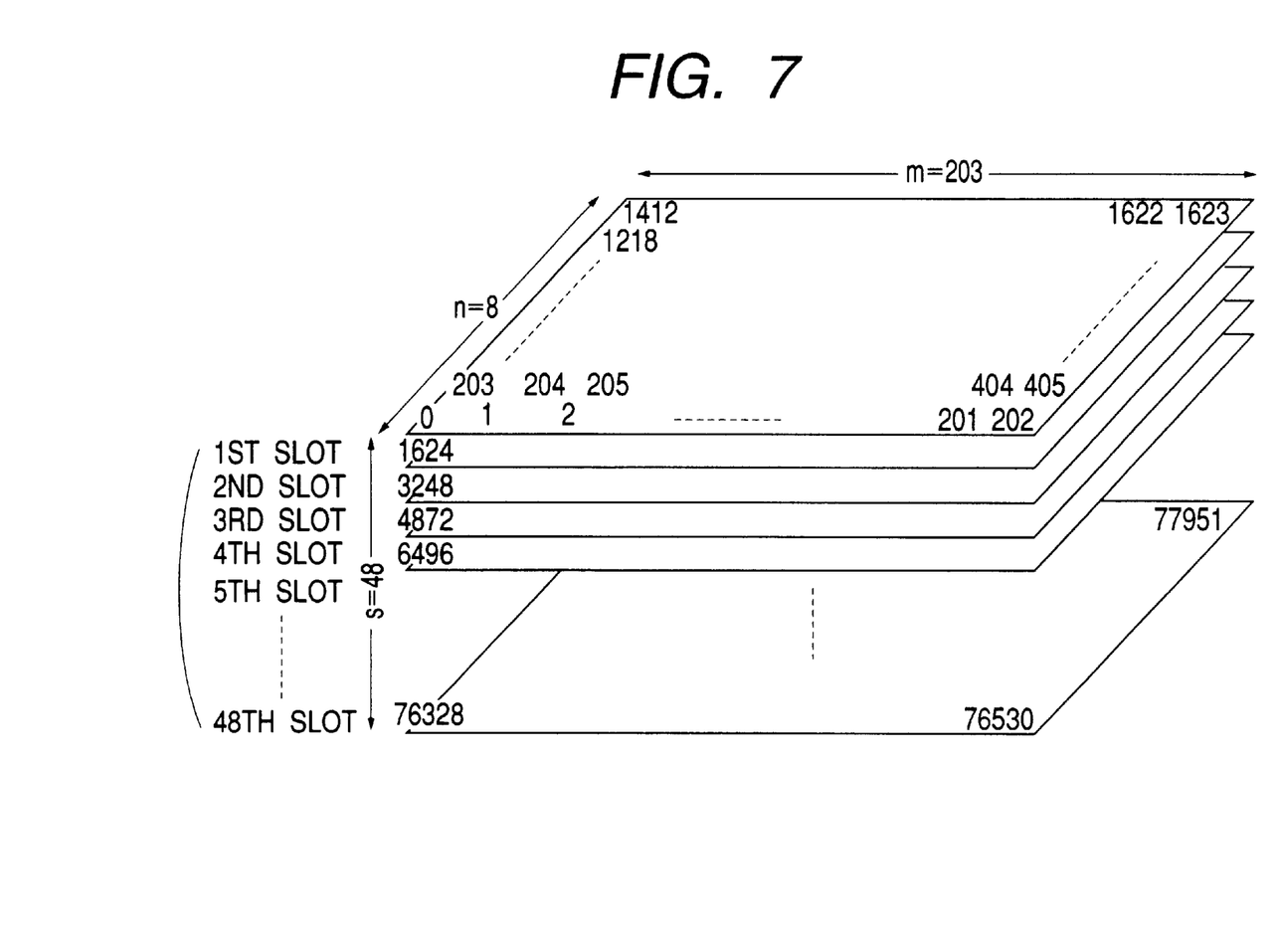
FIG. 7 is a schematic diagram of an address space to explain de-interleave in the de-interleave circuit according to the embodiment of the present invention.

In this embodiment, a 1-superframe memory matrix is defined as shown in FIG. 7. Suppose m=203 (bytes)×n=8 (frames)×S=48 (slots) and the address increments from address 0 in the m direction in a 203×8 two-dimensional matrix, then shifts by one stage in the n direction and increments in the m direction again, . . . and so on. Then, the final address of the 1 slot is 1623. Also suppose that an offset is added by n×m=1624 at a time in the direction from the 1st slot to the 48th slot.

In this case, too, cycle X of address set number x is obtained from x, which satisfies y=1 and A=1 in expression (1) and cycle X of address set number x is 180.

Figure 9:
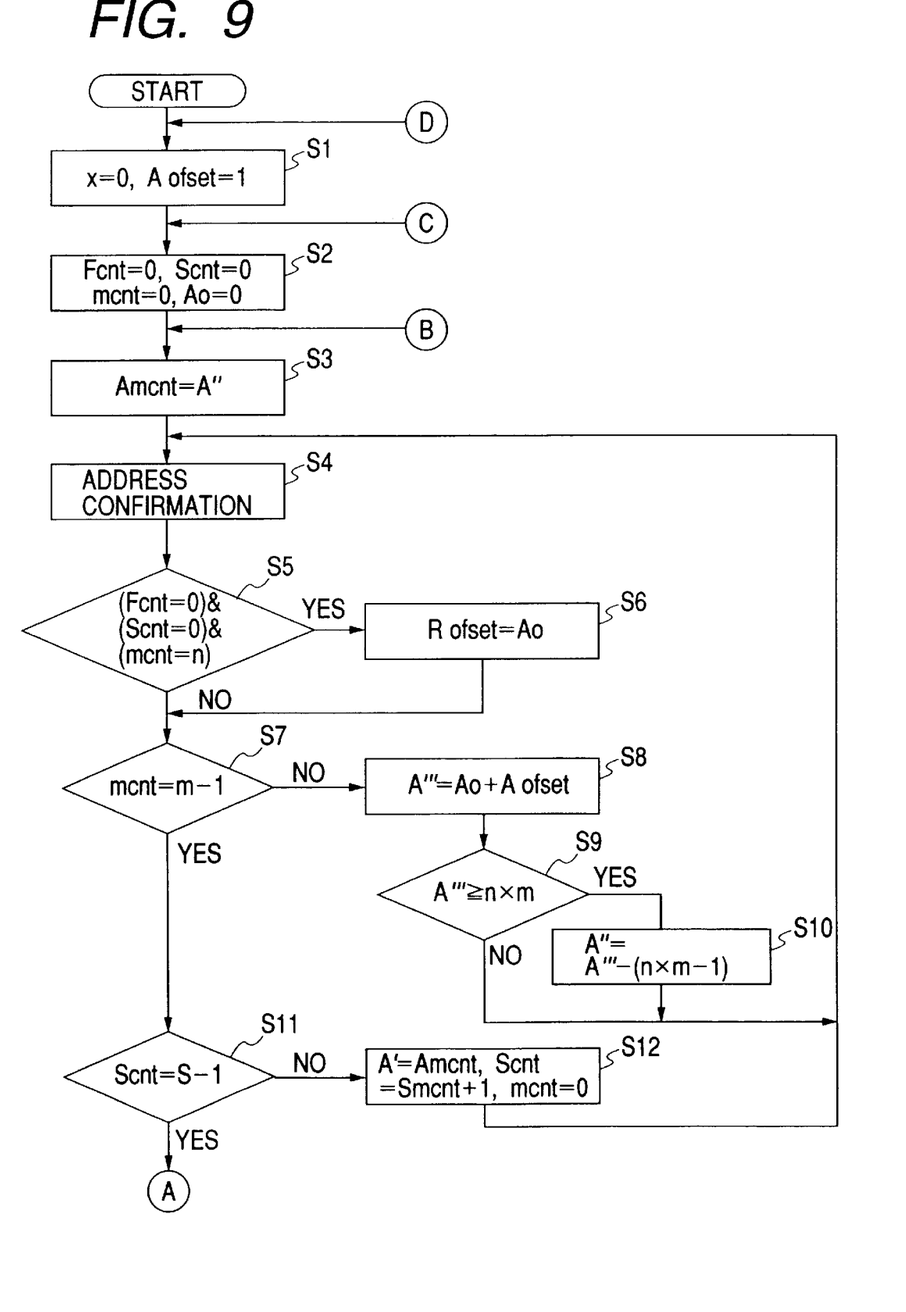
FIG. 9 is a flow chart to explain address data generation in the de-interleave circuit according to the embodiment of the present invention.
Figure 10:
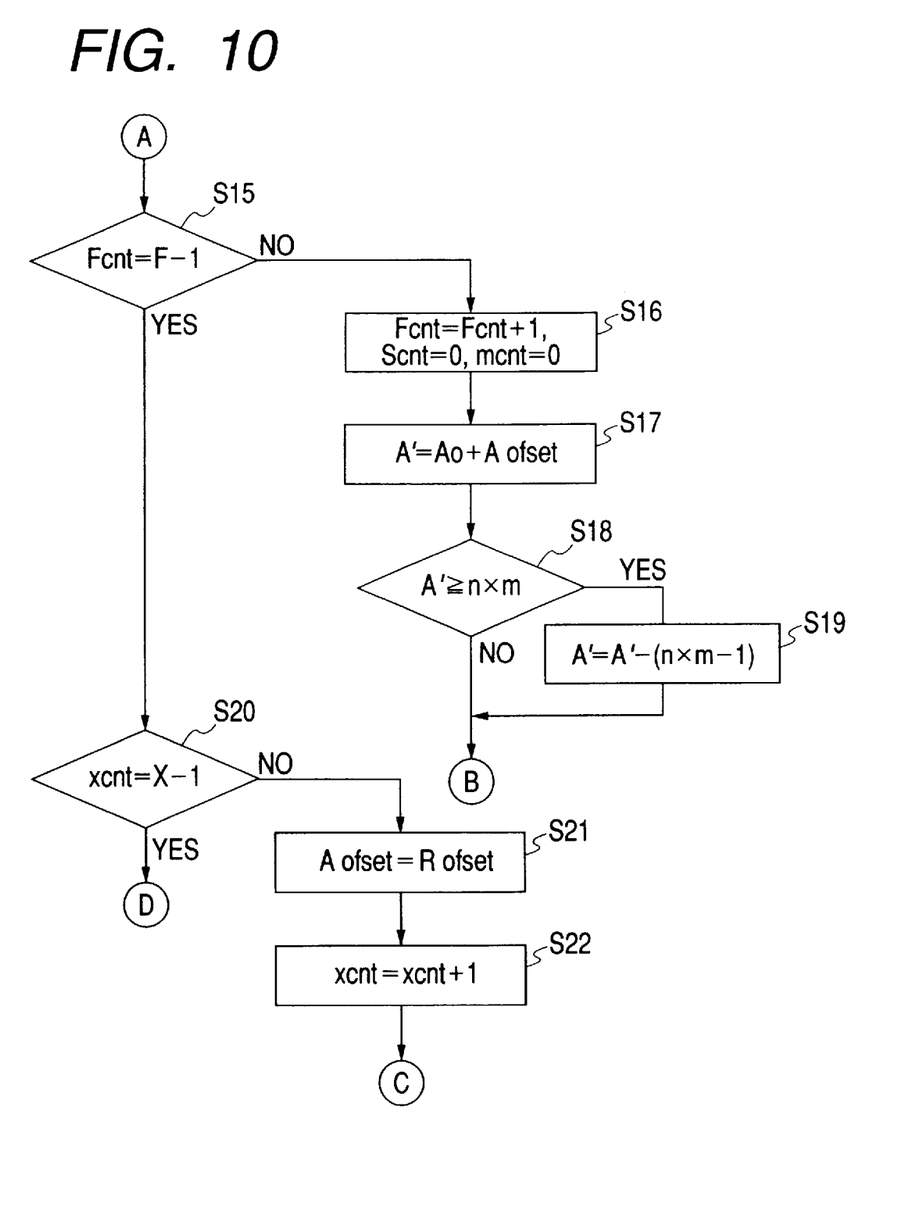
FIG. 10 is a flow chart to explain address data generation in the de-interleave circuit according to the embodiment of the present invention.

FIG. 8 shows the embodiment of the address data generator 3 and FIG. 9 and FIG. 10 show a flow chart indicating the action thereof.

As shown in FIG. 8, the address data generator 3 is provided with a strobe pulse generator 50, a slot number detection section 51 that specifies slot numbers in cooperation with the strobe pulse generator 50 and a modulo operation section 52 that performs modulo operations and sends address data in cooperation with the strobe pulse generator 50 and the slot number detection section 51. Here, m=203 (the number of bytes of a main signal in 1 slot), n=8 (depth of de-interleave), S=48(the number of slots in 1 frame), F=8 (the number of frames making up 1 superframe and F=n=8) and X=180 (cycle of address set count x). Here, the modulo operation section 52 except an adder 70, which will be described later, corresponds to offset value counting means.

The strobe pulse generator 50 comprises a base-m counter 53 that, supplied with de-interleave memory write/read gate pulses output from the timing signal generator 1, receives clock pulses output during the interval that the de-interleave memory write/read gate pulses are at a high potential and counts clock pulses, a base-S counter 54 that counts the carry output of the base-m counter 53, a base-F counter 55 that counts the carry output of the base-S counter 54, a base-X counter 56 that counts the carry output of the base-F counter 55, and a decoder 57 that receives count value mcnt of the base-m counter 53, count value Scnt of the base-S counter 54, count value Fcnt of the base-F counter 55 and count value xcnt of the base-X counter 56 and generates a strobe pulse.

The count value of the base-S counter 54 is incremented every time the base-m counter 53 counts clock pulses 0 to 203 times, which means that the base-S counter 54 detects slot numbers. The slot number detection section 51 comprises a multiplier 58 that receives the count value of the base-S counter 54 and multiplies the count value by (n×m) and generates the slot number start address data 0, 1624, 3248, . . . , 76328 based on the count value of the base-S counter 54. Data A0, which will be described later, is added to this output from the slot number detection 51 and address data A is obtained.

The modulo operation section 52 is provided with a setter 59 that initializes the A offset register 60 to set value "1," an A offset register 60 that receives a strobe pulse "sa" and registers the register value of the R offset register 61, an R offset register 61 that receives strobe pulse "sb" and registers address data A0, an adder 62 that adds up the register values of address data A0 and A offset register 60, a comparator 64 that compares the addition output of the adder 62 and the set value (n×m) of the setter 63, a subtractor 66 that based on the output of the comparator 64 when (addition output of the adder 62≧set value (n×m) of the setter 63), outputs a value obtained by subtracting the set value (n×m−1) of the setter 65 from the addition output of the adder 62 as address data A" and outputs the addition output of the adder 62 as address data A" based on the output of the comparator 64 when (addition output of the adder 62≧set value (n×m) of the setter 63) is not the case, an Amcnt register 67 that receives strobe pulse "sc" and registers the address data A" output from the subtractor 66 as a register value, a selector 68 that selects one of address data A" output from the subtractor 66 and the register value of the Amcnt register 67 through select pulse "sp," a latch 69 made up of a DF/F that delays address data A' output from the selector 68 by 1 clock pulse and an adder 70 that adds up latched address data A0 and the output of the multiplier 58, and designates the output of the adder 70 as address data A.

Strobe pulse "sa" to the A offset register 60 is output in synchronization with the carry output of the base-F counter 55. However, in the case of xcnt=X−1, "1" is registered and in the case of xcnt≠X−1, register value Rofset of the R offset register 61 is registered. Strobe pulse "sb" to the R offset register 61 is output when count value Fcnt of the base-F counter 53 is 0, count value Scnt of the base-S counter 52 is 0 and count value mcnt of the base-m counter 53 is n. Strobe pulse "sc" to the Amcnt register 67 is output when count value Scnt of the base-S counter 52 is 0 and count value mcnt of the base-m counter 53 is 0. Select pulse "sp" to the selector 68 is output when count value mcnt of the base-m counter 53 is m−1 and count value mScnt of the base-S counter 52 is not S−1 and the register value of the Amcnt register 67 is selected.

The adder 62 adds up the value registered in the A offset register and address data A0 and the addition result is sent to the comparator 64 and subtractor 66. Address data A0 is address data in a 203×8 two-dimensional matrix, and the result of an addition of count value Scnt of the base-S counter 54 that counts the number of slots multiplied by n×m by the multiplier 58 (that is, an offset in the slot direction) to address data A0 becomes address data A.

The comparator 64 outputs a subtraction instruction to the subtractor 66 when the addition output of the adder 62 becomes (n×m(=1624) or greater and the subtractor 66 receives the subtraction instruction and subtracts (n×m−1) set in the setter 65 from the addition output from the adder 62. When the addition output of the adder 62 is not equal to or greater than (n×m(=1624), no subtraction is carried out and the addition output of the adder 62 is directly output from the subtractor 66.

In the Amcnt register 67, the address data A" at the time of the occurrence of strobe pulse "sc" is registered, and when the selector 68 receives select signal "sp," register value A" in the Amcnt register 67 is selected and output. The output from the selector 68 is deemed as address data A'. The address data A' is latched by the latch 69 and the latch output is deemed as address data A0. Furthermore, the R offset register 61 receives strobe pulse "sa" and registers data A0 at that time. Moreover, the register value of the R offset register 61 is output to the A offset register 60 and registered in the A offset register 60 upon reception of strobe pulse "sa."

The base-m counter 53, base-S counter 54, base-F counter 55, base-X counter 56 and latch 69 operate on a common clock pulse, but stop operating when the de-interleave memory write/read gate pulse is at a low potential.

The action of the address data generator 3 will be explained based on the flow charts in FIG. 9 and FIG. 10.

When de-interleave is started, register value Aofset of the A offset register 60 is initialized to 1 and the count value xcnt of the base-X counter 56, that is, the address set number x is initialized to 0 (step S1). Furthermore, the count value mcnt of the base-m counter 53, count value Scnt of the base-S counter 54 and count value Fcnt of the base-F counter 55 are initialized to 0, and the latch 69 is also initialized and address data A0 is also initialized (step S2). At this time, data A" is registered in the Amcnt register 67, but in this case 0 is registered (step S3). Moreover, strobe pulse "sc" becomes a high potential when the count value mcnt of the base-m counter 53 is 0, the count value Scnt of the base-S counter 52 is 0, and therefore a value is registered in the Amcnt register 67 for every increment of the base-F counter 55.

The register value to the Amcnt register 67 output via the selector 68 is latched by the latch 69 and address data A0 is confirmed (step S4). In step S5 in which the decoder 57 checks whether count value Fcnt of the base-F counter 55 is 0 or not, count value Scnt of the base-S counter 54 is 0 or not, or count value mcnt of the base-m counter 53 is mcnt=n=8 or not (step S5), in the case where it is decided that count value Fcnt of the base-F counter 55 is 0, count value Scnt of the base-S counter 54 is 0 and count value mcnt of the base-m counter 53 is mcnt=n=8, strobe pulse "sb" is output, address data A0 is registered in the R offset register 61 (step S6) and step S7 is executed. However, since count value mcnt of the base-m counter 53 is 0, step S5 to step S7 are executed.

Until count value mcnt of the base-m counter 53 becomes m−1 (=202) in step S7, count value mcnt of the base-m counter 53 is incremented after step S7 though not shown in FIG. 9, and then step S8 is executed. In step S8, the adder 62 adds up the address data A0 and the register value registered in the A offset register 60 (step S8). In the case where addition output A'" of the adder 62 is (n×m(=1624) or greater (step S9), (n×m−1(=1623) is subtracted from the addition output A'" and the process is repeated from step S4 (step S10). In the case where addition output A'" of the adder 62 is not equal to (n×m(=1624) or greater, the process is repeated from step S4 after step S9.

If the operation so far is checked against the aforementioned addressing general expressions, the register value of the A offset register 60 is equal to n to the xth power (when n to the xth power exceeds (n×m−1), the register value of the A offset register 60 is equal to the remainder when (n×m−1) is subtracted repeatedly) and y×n to the xth power is equal to an accumulated sum of n to the xth power. Moreover, since data A'" never exceeds two times (n×m−1), in the case (n×m−1) is exceeded, the configuration of a modulo operation of (n×m−1) can be simplified by subtracting (n×m−1). At the final address at which data A'" becomes equal to (n×m−1), subtracting (n×m−1) results in 0, causing a problem.

However, since it is only at the final address that A'" becomes equal to (n×m−1), this problem can be avoided by changing the subtraction condition so that (n×m−1) is subtracted when (n×m) is exceeded. This is equivalent to simplifying the condition of A=y as a combination of y=n×m−1 in the above-described addressing general expressions.

In the case where the count value mcnt of the base-m counter 53 is m−1 (=202), the step of a conditional branch based on count value Scnt of the base-S counter 54 is executed (step S11). Step S12 is executed until count value Scnt of the base-S counter 54 becomes S−1 (=47) and the process is repeated from step S4 after step S12. In step S12, count value Scnt of the base-S counter 54 is incremented, count value mcnt of the base-m counter 53 is reset and the register value of the Amcnt register 67 is output as address data A' (step S12), that is, the selector 68 selects the register value of the Amcnt register 67. This operation is carried out to equalize the initial value of address data A of each slot in a frame.

For example, address data A0 of each slot begins with 0 on the 1st frame and begins with 203 on the 2nd frame. Therefore, on the 2nd frame, it is necessary to load 203 in address data A0 every time the slot is changed. Since count value Fcnt of the base-F counter 55 is currently 0, that is, the 1st frame, "0," which is registered in the Amcnt register 67, is loaded for every increment of the slot. The operation above is repeated until count value Scnt of the base-S counter 54 becomes S−1 (=47).

In the case where count value Scnt of the base-S counter 54 becomes S−1 (=47), a conditional branch step based on count value Fcnt of the base-F counter 55 is executed (step S15). In the case where the count value Fcnt of the base-F counter 55 is less than F−1 in step S15, step S16 is executed, count value Fcnt of the base-F counter 55 is incremented and count value Scnt of the base-S counter 54 and count value mcnt of the base-m counter 53 are reset (step S16). Then, A0 is added to the A offset register 60 (step S17). This is because the initial value of address data A0 when the frame is changed is a value next to data A0, which is the final value of the previous frame.

That is, when address set number x is 0, since final address data A0 on the first frame is 202 and at the beginning of the 2nd frame, the register value of the A offset register 60 is "1," 202+1=203. Furthermore, as a result of steps S17, step S18 is executed in which data A'≧(n×m) is checked, and as a result of step S18, step S19 is executed selectively, then step S3 is executed. It is the same as the aforementioned case that (n×m−1) is subtracted when data A' exceeds (n×m) (step S19). Furthermore, this result is registered in the Amcnt register 67 in step S3 and becomes a value loaded every time the slot is changed.

In the case where count value Fcnt of the base-F counter 55 becomes F−1 (=7) in step S15, according to a conditional branch (step S20) based on count value xcnt of the base-X counter 56 whose de-interleave for 1 superframe is completed at this time, step S21 is executed in the case where address set number x does not reach x=X−1 (=179) and the register value of the R offset register 61 registered in step S6 is registered in the A offset register 60 (step S21). Furthermore, address set number x is incremented (step S22).

This operation will be explained according to the general expressions of addressing; expression (1) and expression (2).

The register value of the A offset register 60 is equal to address data A (value of A=1×n to the xth power) (equal to a remainder when the subtraction is repeated with (n×m−1) in the case where the value of n to the xth power exceeds (n×m−1) as described above) and register value Aofset' of the A offset register 60 of the next address set becomes 1×n to the (x+1)th power=1×n to the xth power×n=8×n to the xth power, and this is equal to address data A when y=8. In other words, if address data A of current y=8 is stored, this becomes Aofset', which is the register value of the A offset register 60 of the next address set number x and this means that a calculation circuit can be omitted. Since in step S5 and step S6, address data A when y=mcnt=n=8 is stored in the R offset register 61, this is written in the A offset register 60 before moving to the next address set. Moreover, when count value xcnt of the base-X counter 56 becomes X−1 (=179), all values are initialized.

Figure 11:
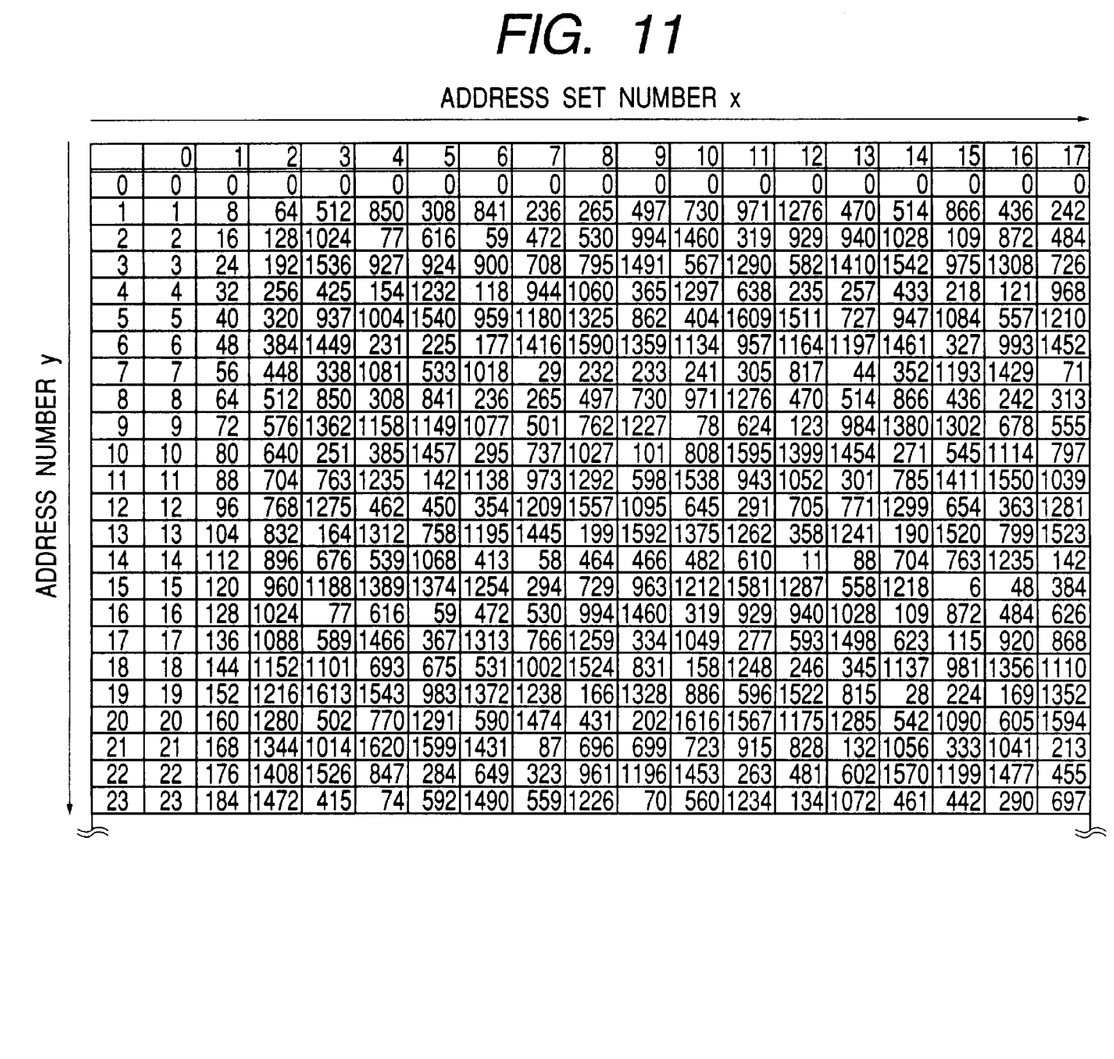
FIG. 11 is a schematic diagram showing some addresses generated in the de-interleave circuit according to the embodiment of the present invention.
Figure 12:
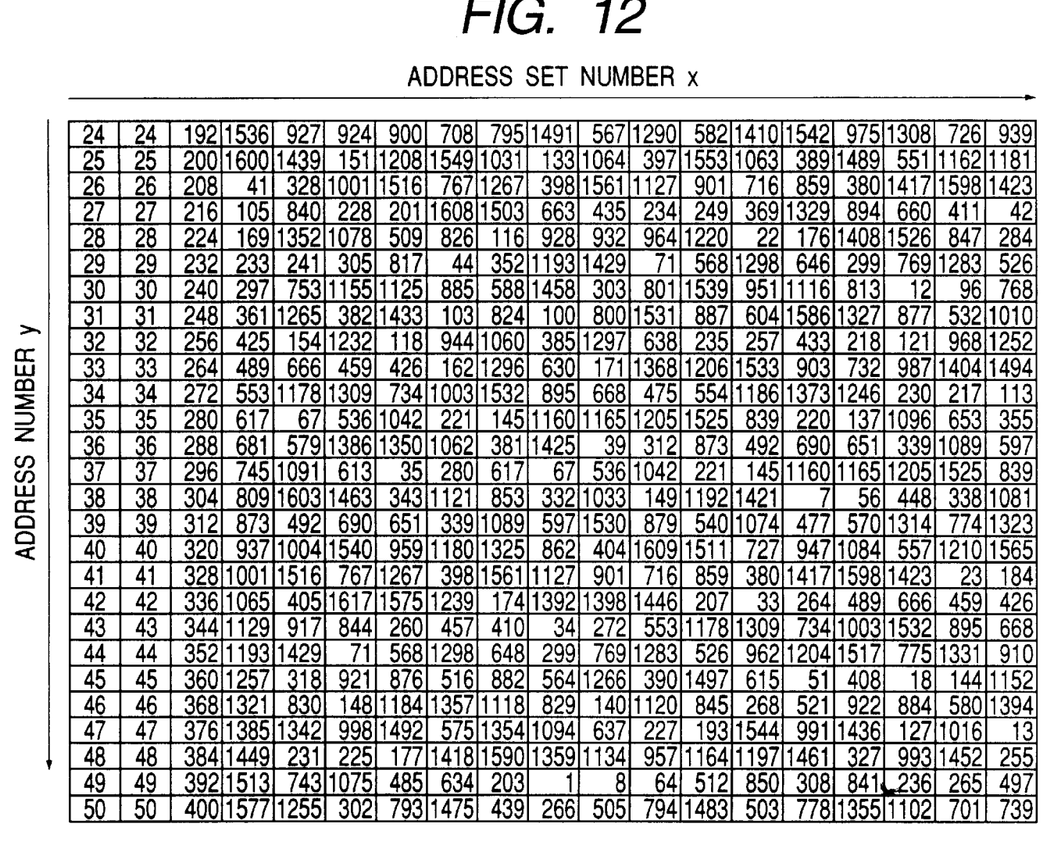
FIG. 12 is a schematic diagram showing some addresses generated in the de-interleave circuit according to the embodiment of the present invention.

FIG. 11 and FIG. 12 show part of address data A created by this embodiment. Due to limitations of space, address set number x of up to 17 and address number y of up to 50 are shown.

As shown above, according to the de-interleave circuit according to this embodiment, reads are performed ahead of writes on address data A to the de-interleave memory 4 generated by the address data generator 3 as read (R), write (W), read (R), write (W), . . . and writing data in an address which is emptied by data read improves the efficiency of memory utilization.

On the other hand, it is possible to provide, for example, two address data generators, use one for read address data generation only and the other for write address data generation only and thereby carry out reading at high speed in superframe units. In this case, the address data must be the same address data. For example, according to the timing shown in FIG. 3, a pattern of a 4-byte stop period provided after both 203-byte read/write processing is repeated, but it is also possible to perform reads consecutively without any 4-byte stop period for reads only.

INDUSTRIAL APPLICABILITY

As described above, the de-interleave circuit according to the present invention makes it possible to carry out de-interleave with a storage capacity for 1 superframe, which brings about an effect of reducing the number of parts and parts cost. Moreover, when implemented in an integrated circuit, the present invention can reduce the number of gates and drastically reduce the chip area compared to the prior art.

What is claimed is:

1. A de-interleave circuit for recovering an original data arrangement from an interleaved data arrangement of a main signal, said interleaved data arrangement being formed in such a way to execute interleaving between slots having an identical frame slot number in a superframe direction, said de-interleave circuit, comprising:

a de-interleave memory having a storage capacity of one superframe; and address data generating means for generating address data to specify a data read/write address location to said de-interleave memory, characterized in that said main signal stored in the memory address location specified by the address data generated by the address generating means is read and a following main signal to be interleaved and inputted is written in said address location, wherein said address data generating means generates address data A, where the number of main signals in 1 slot is designated as m, the depth of de-interleave is designated as n, a specific address number assigned to said de-interleave memory is designated as y, and address-data that specifies a data read/write address location is designated as A, and a modulo b is defined as being a remainder of a−αb (where each of a, α, and b is a natural number including 0), when (y≠n×m−1), A=y×n to the xth power modulo (n×m−1), and when (y=n×m−1), A=y, a value of address set number, which is the number of times data of up to address number y is repeatedly specified, is equal to an x that when y=1, A=1 in A=y×n to the xth power modulo (n×m−1) and when the value of y×n to the xth power is less than (n×m−1), A=(y×n to the xth power).

2. The de-interleave circuit according to claim 1, characterized in that said address data generating means comprising:

a base-m counter that counts the number of main signals input;

a base-S counter that counts a carry of the base-m counter;

a multiplier that multiplies the count value of the base-S counter by (n×m);

offset value counting means that counts the number of main signals in the slot direction, shifts by one stage in the n direction when the main signal count value reaches (m−1) and counts main signals in the slot direction, and continues to count by repeating this procedure until the count value reaches (n×m); and adding means that adds up the output of the multiplier and the count value of the offset value counting means, in which the output of the adding means is deemed as address data A.

* * * * *